United States Patent [19]

Kennedy

[11] Patent Number: 5,434,413
[45] Date of Patent: Jul. 18, 1995

[54] VIRTUAL COLD SHIELD AND COLD FILTER FOR INFRARED DETECTOR ARRAYS

[75] Inventor: Howard V. Kennedy, Dallas, Tex.

[73] Assignee: Texas Instruments Incorporated, Dallas, Tex.

[21] Appl. No.: 130,204

[22] Filed: Oct. 1, 1993

[51] Int. Cl.$^6$ ............................................. G01J 5/06
[52] U.S. Cl. .................................................. 250/352
[58] Field of Search ........................... 250/352; 62/51.1

[56] References Cited

U.S. PATENT DOCUMENTS

| | | | |
|---|---|---|---|
| 4,307,388 | 12/1981 | Doenges et al. | 250/352 |
| 4,783,593 | 11/1988 | Noble | 250/352 |
| 5,315,116 | 5/1994 | DuPree et al. | 250/352 |

FOREIGN PATENT DOCUMENTS 0033517 4/1981 Japan ................................ 250/352

Primary Examiner—Paul M. Dzierzynski
Assistant Examiner—Richard Hanig
Attorney, Agent, or Firm—René E. Grossman; Richard L. Donaldson

[57] ABSTRACT

A cold shield having an evacuated enclosure having a first aperture therein for transmission of radiations and a baffle disposed within the enclosure having a second aperture larger than the first aperture and aligned with the first aperture and having a detector disposed on a surface thereof opposite the second window. The first aperture includes a radiation transmissive member and a radiation opaque member disposed on the surface of the radiation transmissive member and external to the evacuated enclosure. A radiation band pass filter is disposed on the radiation transmissive member. The interior of the baffle is coated with an absorptive low reflecting material and the exterior surface of the baffle opposing the first aperture is coated with an absorptive low reflecting material.

20 Claims, 1 Drawing Sheet

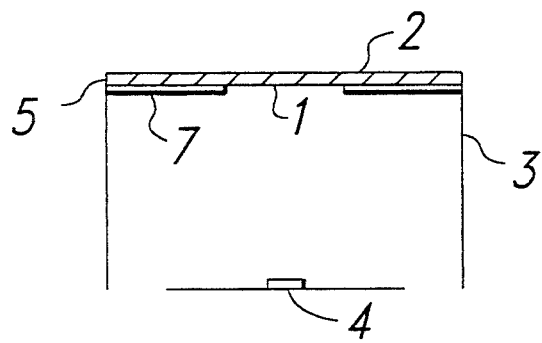
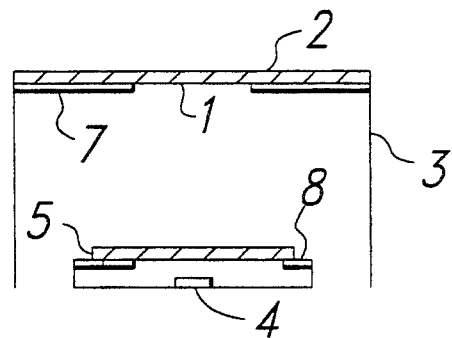
Fig. 1a PRIOR ART
Fig. 1b PRIOR ART
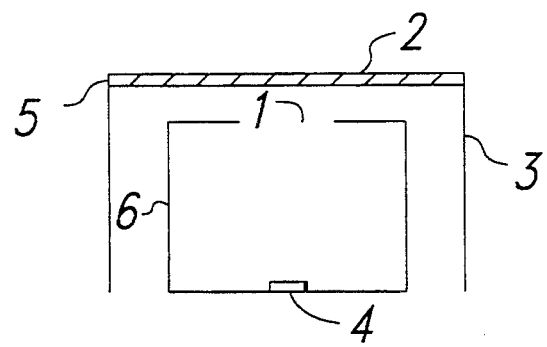
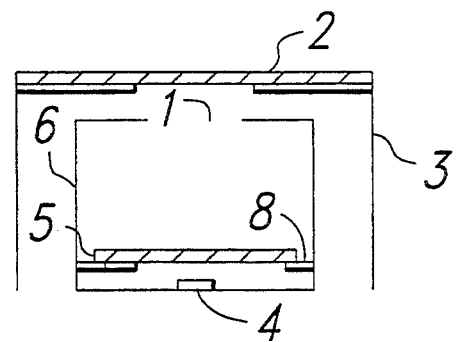
Fig. 1c PRIOR ART
Fig. 1d PRIOR ART
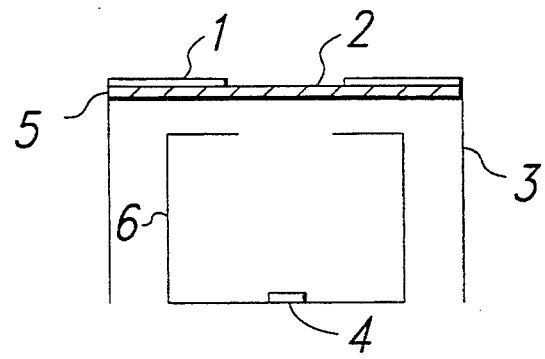
Fig. 2

VIRTUAL COLD SHIELD AND COLD FILTER FOR INFRARED DETECTOR ARRAYS

BACKGROUND OF THE INVENTION

1. Field of the Invention

This invention relates to a cold shield and cold filter for infrared detector arrays.

2. Brief Description of the Prior Art

The sensitivity of infrared detectors depends upon both their signal response and upon the noise associated with the detection process. The most sensitive such detectors are photon detectors, that is, those detectors whose signal response is proportional to the number of photons incident thereon. The limit of performance of such detectors is set by the random fluctuations in the rate at which background photons are received. Detectors for which this is true are generally referred to as "background limited". The magnitude of the fluctuation energy is very nearly proportional to the total number of photons detected. It follows that, for photon detectors, the output signal-to-noise ratio is maximized by rejecting all radiation that does not contribute appreciably to the signal while accepting all radiation that does so contribute.

Radiation which contributes to the signal at the detector plane is defined in two ways: (1) geometrically and (2) spectrally. The geometric definition is determined by the optical system associated with the detector array. All energy gathering and imaging optical systems have an aperture and an aperture stop which determines how much energy is gathered by a detector element. The spectral definition is determined by the type of radiation source being detected, modified by the spectral transmission of the atmosphere intervening between the source and the optics and detector. Maximizing the signal requires that the vacuum chamber, generally a Dewar, be so constructed that as much of the geometric and spectral content of the signal as possible is accepted.

Maximizing the signal-to-noise ratio requires a balance between the amount of signal collected and the amount of noise generated by the total photon flux. Geometrically, both maximizing the signal collected and minimizing the non-signal radiation collected can be accomplished by making the aperture stop a physical part of the detector. Any surfaces that are within the view of the detector array outside the aperture stop must be cold and black (highly emissive and low reflecting) so that they produce a negligible photon flux at the detector array. These surfaces are usually cooled by the same cooling mechanism employed to cool the detector array. All known "background limited" photon detectors must be cooled to reduce other detector noise mechanisms to a level below that induced by the background flux. The photon detectors are mounted in thermal contact with the cooling means, are packaged within a vacuum space for thermal isolation and receive the signal radiation through an optical window placed in one wall of the vacuum space.

To eliminate radiation that contributes less to signal than to background because of the wavelength span it covers requires the use of a bandpass spectral filter. This filter must be placed so that no radiation having significant energy content at wavelengths outside the filter bandpass can reach the detector array.

The problem being addressed is that of configuring a detector array within a vacuum space, with an aperture or stop defining the geometrical limits and a spectral filter defining the spectral limits of the radiation the detector array can receive.

FIGS. 1a to 1d illustrate several prior art approaches to solving the problem as set forth above. The configuration of FIG. 1a includes a vacuum containing vessel having a vacuum wall 3, which can be a Dewar, having a detector array 4 therein. The side of the enclosure facing the detector array 4 includes a wall 7 of a material opaque to incoming radiation and which is secured to the vacuum wall 3. The wall 7 has an aperture 1 therein and a window 2 having a filter coating or coatings 5 thereon secured to the wall 7 and disposed over the aperture to provide the aperture with a filter thereover for incoming radiations to the detector array 4. This configuration places spectral filter coatings on one or both surfaces of the vacuum window 2 and places the aperture 1 in the interior surface of the window. The detector can receive radiation both emitted by the warm vacuum wall as well as reflected by the wall from other surfaces within the vacuum. This is a poor solution to the problem because a significant amount of radiation can reach the detector which originates external to the geometrical limits of the aperture 1 and external to the spectral limits of the filter coatings 5.

The configuration of FIG. 1b is the same as in FIG. 1a except that the filter coating 5 is disposed within the vacuum vessel and between the detector array 4 and the aperture 1. This configuration achieves a somewhat better result than that of FIG. 1a by placment of the filter coatings on a substrate immediately in front of the detector array. The coatings on the window can now become anti-reflectance coatings which provide high transmission over the filter spectral band. The spectral content of the radiation impinging on the detector array is now restricted to the desired pass band. The detector is still not restricted geometrically, however, so it can still receive spurious radiation by way of the vacuum wall. This configuration has the additional drawback that the filter substrate 8 adds mass to the cooled region, thereby adding to the time required to cool the detector array 4 to its operating temperature.

The configuration of FIG. 1c is an improved version of FIG. 1a except that the wall 7 is removed and the window 2 with filter coating 5 thereon is secured to the vacuum wall 3 directly to provide the vacuum vessel. Additionally, a baffle 6 is provided within the vacuum vessel and has an aperture 1 therein through which radiation travels to the detector array 4 at the surface of the baffle opposing the aperture. This configuration moves the aperture 1 to an enclosed shield or baffle 6 surrounding the detector array 4. Coating the interior surface of this baffle 6 with a highly emissive (therefore low reflecting) coating reduces the radiation reaching the detector array 4 from the baffle interior to a negligible amount. The aperture 1 of this baffle now becomes the aperture stop of the optical system, establishing a limit to the angles at which the detector array 4 can receive radiation. If the top, outer surface of the baffle 6 is highly emissive, this configuration achieves the desired geometric and spectral restriction of background radiation. If the surface is reflective, however, a significant amount of spurious radiation can reach the detector array 4 by multiple reflections between the window surfaces 2 and the top surface of the baffle. Since this radiation is not filtered by the window coatings, it will be at wavelengths outside the spectral bandpass of the window.

The major drawback of the configuration of FIG. 1c is the inaccessibility of the aperture 1. Since either the window substrate 2 or its coatings 5 are usually visibly opaque, the location of the aperture 1 cannot be determined by visible means. Another drawback is the necessity to strike a compromise between baffle rigidity and heat load imposed upon the cooling means. The baffle 6 must have sufficient mass to make it rigid enough to avoid motion of the aperture 1 with respect to the optical system, thereby modulating the background radiation reaching the detector array 4 and creating a spurious signal. Too much mass increases the time required to cool the baffle 6 and detector array 4 to operating temperature.

The configuration of FIG. 1d is a combination of the configurations of FIGS. 1b and 1c and uses the filter position of FIG. 1b and the aperture position of FIG. 1c. The drawbacks to this configuration are aperture inaccessibiltiy, lack of rigidity and excess cool-down time.

SUMMARY OF THE INVENTION

The present invention solves the problem of eliminating spurious radiation in a particularly attractive way with all of the advantages and few of the disadvantages of the prior art solutions as demonstrated hereinabove.

Briefly, this is accomplished by the novel placement of a baffle and an aperture, by the use of broad spectrum absorptive and reflective coatings and by the novel placement of these coatings in combination with spectral bandpass coatings. Typical broad spectrum absorptive coatings that can be used are paints with a high carbon black content or evaporated multi-layer coatings with a highly absorbing semi-metal as one of the layers. Typical reflective coatings that can be used are evaporated or sputtered metal films of aluminum, gold, or chromium.

In accordance with the present invention, the aperture stop of the optical system is placed on the outer surface of and external to the vacuum window and is therefore easily accessible for alignment purposes as compared with the above described prior art. The preferred means for defining the aperture stop is by deposition of highly reflecting, opaque film. A machined aperture in a highly reflective metal plate or deposited metal with aperture, placed in proximity to the window, can also be used. A baffle is placed within the vacuum space, surrounding the detector array, with an aperture that is just larger than the aperture stop on the window so that the total radiation reaching the detector is restricted, but the signal radiation as defined by the aperture stop is not so restricted. The baffle need not be of heavy construction since it can be permitted to move slightly under vibration as long as it does not encroach into the space occupied by the signal radiation. The baffle can therefore be light weight relative to the above described prior art baffles and preferably is of a material having low specific heat, preferably aluminum. Thereby, the baffle requires less cooling power than the rigid higher mass prior art baffles and cools down more quickly. The vacuum window is constructed of a non-radiation-absorbing material and coated to serve as a bandpass filter. Both the interior surface of the baffle and its top outer surface are coated to be highly absorptive. Typical highly absorptive coatings that can be used are paints with a high carbon black content or evaporated multilayer coatings with a highly absorbing semi-metal as one of the layers.

The advantages of the invention over the prior art are at least threefold, these being suppression of spurious radiation without decreasing signal radiation, provision of a readily accessible aperture stop which may be rigidly supported and addition of less mass to the cooled region that in the prior art.

The present invention provides about the same signal-to-noise ratio as the better prior art configurations and provides a better signal-to-noise ratio than the other prior art configurations. The present invention essentially matches the signal-to-noise ratio of the better prior art configurations by providing a slightly higher signal level, offsetting a slightly higher noise level.

The signal level of the present invention equals or exceeds that of the other configurations because it uses only one rather than two optical elements. Since the filter transmissions of all configurations are the same, the lack of a second optical element in the present invention provides a greater signal level. The noise level of the present invention is slightly higher than the better prior art configurations because of the emission of the small area around the perimeter of the aperture stop which is exposed to the detector. The emitted radiation is minimized by making the aperture material have a high reflectivity and therefore a low emissivity.

BRIEF DESCRIPTION OF THE DRAWINGS

FIGS. 1a to 1d are schematic diagrams of prior art cold shield and cold filter configurations; and FIG. 2 is a schematic diagram of a cold shield and cold filter configuration in accordance with the present invention.

DESCRIPTION OF THE PREFERRED EMBODIMENT

Referring now to FIG. 2, there is shown a cold shield and cold filter in accordance with the present invention. The configuration of FIG. 2 includes a vacuum containing vessel having a vacuum wall 3, which can be a Dewar, and a window 2 with filter coating 5 thereon which is secured directly to the vacuum wall to provide the vacuum vessel. The aperture stop 1 of the optical system is preferably a light reflecting material with the aperture therein, for example, an evaporated aluminum coating or a piece of metal with an aperture cut therein which is secured to the outer surface of the vacuum window 2 by an epoxy or other adhesive agent. The preferred means for defining the aperture stop is by deposition of a highly reflecting, opaque film, preferably aluminum. A machined aperture in a highly reflective metal plate, placed in proximity to the window can also be used. A baffle 6 is placed within the vacuum space spaced from the walls, surrounding the detector array 4 with an aperture that is just larger than the aperture stop 1 on the window 2 so that it restricts the total radiation reaching the detector array, but not the signal radiation as defined by the aperture stop. The baffle need not be of heavy construction, since it can be allowed to move slightly under vibration as long as it does not encroach into the space occupied by the signal radiation. The vacuum window 2 is constructed of a non-radiation-absorbing material, such as, for example, germanium, zinc selenide or other well known optical material and is coated with a suitable multilayer evaporated thin film coating 5 to serve as an optical bandpass filter. Both the interior surface of the baffle 6 and its top outer surface are coated with absorptive paint or other coating absorptive to be highly emissive and therefore low reflecting to reduce the radiation reaching the detector from the baffle interior to a negligible amount. If the top, outer surface of the baffle 6 is highly emissive, this configuration achieves the desired geometric and spectral restriction of background radiation.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A cold shield which comprises:
   (a) an evacuated enclosure defined by walls, one of said walls having a first aperture for transmission of radiations into said enclosure; and
   (b) a baffle disposed within said enclosure, spaced from said walls and having a second aperture aligned with said first aperture and having a detector disposed on a surface thereof opposite and facing said second aperture.

2. The shield of claim 1 wherein said first aperture is smaller than said second aperture.

3. The shield of claim 1 wherein said one of said walls is radiation transmissive and said first aperture is defined by a radiation opaque member disposed on the surface of said radiation transmissive member and external to said evacuated enclosure.

4. The shield of claim 2 wherein said one of said walls is radiation transmissive and said first aperture is defined by a radiation opaque member disposed on the surface of said radiation transmissive member and external to said evacuated enclosure.

5. The shield of claim 3 further including a radiation band pass filter disposed on said radiation transmissive member.

6. The shield of claim 4 further including a radiation band pass filter disposed on said radiation transmissive member.

7. The shield of claim 1 wherein the interior of said baffle is coated with a radiation absorptive, low reflecting material.

8. The shield of claim 2 wherein the interior of said baffle is coated with a radiation absorptive, low reflecting material.

9. The shield of claim 3 wherein the interior of said baffle is coated with a radiation absorptive, low reflecting material.

10. The shield of claim 4 wherein the interior of said baffle is coated with a radiation absorptive, low reflecting material.

11. The shield of claim 5 wherein the interior of said baffle is coated with a radiation absorptive, low reflecting material.

12. The shield of claim 6 wherein the interior of said baffle is coated with a radiation absorptive, low reflecting material.

13. The shield of claim 7 wherein the exterior surface of said baffle opposing said first aperture is coated with a radiation absorptive low reflecting material.

14. The shield of claim 8 wherein the exterior surface of said baffle opposing said first aperture is coated with a radiation absorptive low reflecting material.

15. The shield of claim 9 wherein the exterior surface of said baffle opposing said first aperture is coated with a radiation absorptive low reflecting material.

16. The shield of claim 10 wherein the exterior surface of said baffle opposing said first aperture is coated with a radiation absorptive low reflecting material.

17. The shield of claim 11 wherein the exterior surface of said baffle opposing said first aperture is coated with a radiation absorptive low reflecting material.

18. The shield of claim 12 wherein the exterior surface of said baffle opposing said first aperture is coated with a radiation absorptive low reflecting material.

19. The shield of claim 12 wherein said one of said walls is formed from one of germanium or zinc selenide and said radiation opaque member is aluminum.

20. The shield of claim 18 wherein said one of said walls is formed from one of germanium or zinc selenide and said radiation opaque member is aluminum.

* * * * *